United States Patent
Fukue (10) Patent No.: US 9,812,423 B2
(45) Date of Patent: Nov. 7, 2017

(54) SEMICONDUCTOR DEVICE HAVING WIRE FORMED WITH LOOP PORTION AND METHOD FOR PRODUCING THE SEMICONDUCTOR DEVICE

(71) Applicant: AOI Electronics Co., Ltd., Takamatsu-shi, Kagawa (JP)

(72) Inventor: Naoki Fukue, Kagawa (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 0 days.

(21) Appl. No.: 15/039,083

(22) PCT Filed: Nov. 19, 2014

(86) PCT No.: PCT/JP2014/080670
§ 371 (c)(1),
(2) Date: May 25, 2016

(87) PCT Pub. No.: WO2015/080000
PCT Pub. Date: Jun. 4, 2015

(65) Prior Publication Data
US 2017/0053893 A1    Feb. 23, 2017

(30) Foreign Application Priority Data
Nov. 29, 2013    (JP) ................................. 2013-247099

(51) Int. Cl.
*H01L 31/02*    (2006.01)
*H01L 23/00*    (2006.01)
(Continued)

(52) U.S. Cl.
CPC ............ *H01L 24/85* (2013.01); *H01L 21/563* (2013.01); *H01L 23/3121* (2013.01);
(Continued)

(58) Field of Classification Search
CPC ...... H01L 24/85; H01L 23/3121; H01L 24/48; H01L 24/45; H01L 24/73; H01L 21/563
(Continued)

(56) References Cited

U.S. PATENT DOCUMENTS

| 2004/0191954 A1 | 9/2004 | Ano |
| 2006/0163331 A1 | 7/2006 | Babinetz |
| 2012/0018768 A1 | 1/2012 | Li et al. |
| 2017/0053893 A1* | 2/2017 | Fukue ................ H01L 24/85 |

FOREIGN PATENT DOCUMENTS

| CN | 103026509 A | 4/2013 | |
| JP | 2-215137 A * | 8/1990 | ............. H01L 21/60 |

(Continued)

OTHER PUBLICATIONS

International Search Report (PCT/ISA/210) issued in PCT Application No. PCT/JP2014/080670 dated Feb. 24, 2015 with English translation (three pages).
(Continued)

*Primary Examiner* — Alexander Oscar Williams
(74) *Attorney, Agent, or Firm* — Crowell & Moring LLP (57) ABSTRACT

A semiconductor device includes: a connection terminal; a semiconductor chip having an electrode pad on one surface; a wire that connects the connection terminal and the electrode pad of the semiconductor chip; and transparent resin that covers the one surface of the semiconductor chip, and that seals the connection terminal and the wire, wherein: the wire includes a first bonded portion that is joined to the electrode pad, a second bonded portion that is joined to the connection terminal, and a loop portion that is formed so as to be continuous with the first bonded portion and has a turned back portion on a side opposite to the second bonded portion; and predetermined clearances are provided between the loop portion and the first bonded portion, and between the loop portion and other portions of the wire.

13 Claims, 4 Drawing Sheets

(51) Int. Cl.
  *H01L 23/31* (2006.01)
  *H01L 21/56* (2006.01)
  *H01L 33/62* (2010.01)

(52) U.S. Cl.
  CPC .............. *H01L 24/45* (2013.01); *H01L 24/48* (2013.01); *H01L 24/73* (2013.01); *H01L 31/02* (2013.01); *H01L 33/62* (2013.01); *H01L 2224/32225* (2013.01); *H01L 2224/45144* (2013.01); *H01L 2224/45147* (2013.01); *H01L 2224/4809* (2013.01); *H01L 2224/48227* (2013.01); *H01L 2224/48465* (2013.01); *H01L 2224/49175* (2013.01); *H01L 2224/73265* (2013.01); *H01L 2224/78301* (2013.01); *H01L 2224/85* (2013.01); *H01L 2224/85181* (2013.01); *H01L 2924/181* (2013.01)

(58) Field of Classification Search
  USPC .................................. 257/784, 786, 774, 773
  See application file for complete search history.

(56) References Cited

FOREIGN PATENT DOCUMENTS

| | | | |
|---|---|---|---|
| JP | 6-66352 | * | 8/1994 |
| JP | 2004-31451 A | | 1/2004 |
| JP | 2004-289153 A | | 10/2004 |
| JP | 2008-529278 A | | 7/2008 |
| TW | 201214807 A1 | | 4/2012 |
| WO | WO 2012/018593 A1 | | 2/2012 |

OTHER PUBLICATIONS

Japanese-language Written Opinion (PCT/ISA/237) issued in PCT Application No. PCT/JP2014/080670 dated Feb. 24, 2015 (three pages).

Japanese-language International Preliminary Report on Patentability (PCT/IPEA/409) issued in PCT Application No. PCT/JP2014/080670 dated Nov. 12, 2015 (three pages).

* cited by examiner

SEMICONDUCTOR DEVICE HAVING WIRE FORMED WITH LOOP PORTION AND METHOD FOR PRODUCING THE SEMICONDUCTOR DEVICE

TECHNICAL FIELD

This invention relates to a semiconductor device and to a method for producing a semiconductor device, and, in more detail, relates to a semiconductor device in which a semiconductor chip and a connection terminal are connected together by a wire and are sealed with transparent resin, and to a method for producing such a semiconductor device.

BACKGROUND ART

For example, in a semiconductor device in which a light reception element or the like is provided upon the main surface, an electrode pad that is provided near the light reception element may be electrically connected to a connection terminal that is provided upon a circuit board by wire bonding, and the wire and the semiconductor chip may be sealed with transparent resin. In such a semiconductor device in which a semiconductor chip and a connection terminal are connected together by wire bonding, a technique is per se known in which, in order to keep the profile of the semiconductor device low, one end of a wire is ball bonded to the electrode pad of the semiconductor chip, and a loop portion is formed in this wire, this loop portion being continuous from this bonded portion and protruding in the direction opposite to the portion of the wire that is bonded to the connection terminal.

In other words, this loop portion has a turned back portion extending in the opposite direction to the portion of the wire that is bonded to the connection terminal, and this loop portion is squashed down so that a concave portion is formed at the upper central wire portion that is pressed down toward the ball portion that has been created by the bonding process, and moreover so that the lower surface of the central portion of the loop portion contacts another portion of the loop portion that is formed above the ball portion (for example refer to FIG. 5 of Patent Literature #1).

CITATION LIST

Patent Literature

Patent Literature #1: Japanese Patent Publication 2008-529278.

SUMMARY OF INVENTION

Technical Problem

With the method described in Patent Literature #1, it is possible to lower the profile of the semiconductor device. However, with a semiconductor device in which a semiconductor chip is sealed with resin, thermal stresses are applied to the wire due to differences between the thermal expansion coefficients of the semiconductor chip, the board that supports the semiconductor chip, and the resin, and accordingly there is a possibility of breakage of the wire. In particular, with a semiconductor device that incorporates a light reception element or the like, since there is a requirement for ensuring the translucency of the transparent sealing resin, accordingly it is not possible to mix into the transparent resin a filler such as silica or the like whose coefficient of thermal expansion is low, in order to bring its coefficient of linear expansion closer to that of the semiconductor chip. Due to this, the thermal stress imposed upon the wire is increased by yet a further level.

Solution to Technical Problem

According to the 1st aspect of the present invention, a semiconductor device, comprises: a connection terminal; a semiconductor chip having an electrode pad on one surface; a wire that connects the connection terminal and the electrode pad of the semiconductor chip; and transparent resin that covers the one surface of the semiconductor chip, and that seals the connection terminal and the wire, wherein: the wire includes a first bonded portion that is joined to the electrode pad, a second bonded portion that is joined to the connection terminal, and a loop portion that is formed so as to be continuous with the first bonded portion and has a turned back portion on a side opposite to the second bonded portion; and predetermined clearances are provided between the loop portion and the first bonded portion, and between the loop portion and other portions of the wire.

According to the 2nd aspect of the present invention, in the semiconductor device according to the 1st aspect, it is preferred that a clearance that separates the loop portion and the first bonded portion is around 0.3 to 1.5 times a diameter of the wire.

According to the 3rd aspect of the present invention, in the semiconductor device according to the 1st or the 2nd aspect, it is preferred that: the semiconductor device further comprises a board; the connection terminal is provided upon the board; and the semiconductor chip is die bonded upon the board.

According to the 4th aspect of the present invention, in the semiconductor device according to any one of the 1st through 3rd aspects, it is preferred that no filler made from silica is included in the transparent resin.

According to the 5th aspect of the present invention, in the semiconductor device according to any one of the 1st through 4th aspects, it is preferred that: the one surface of the semiconductor chip is shaped as rectangular; the semiconductor chip has a plurality of electrode pads arranged along each of at least a pair of mutually opposing side edges of the one surface; connection terminals are arranged to correspond to the electrode pads; each of the connection terminals and each of the electrode pads are connected together by one of the wire; and the loop portion is formed upon at least the wire that is provided in a position closest to a corner portion of the semiconductor chip.

According to the 6th aspect of the present invention, in the semiconductor device according to the 5th aspect, it is preferred that the loop portion is formed in all wires.

According to the 7th aspect of the present invention, a method for producing a semiconductor device, comprises: providing a board upon which connection terminals are formed; mounting upon the board a semiconductor chip upon which electrode pads are formed, and bonding each of the connection terminals and each of the electrode pads by a wire; and sealing a main surface of the semiconductor chip, the wire, and a portion of the board that is not covered by the semiconductor chip, with transparent resin, wherein: when wire bonding each of the connection terminals and each of the electrode pads one end of the wire is ball bonded upon an electrode pad, and a ball portion is formed upon the electrode pad, a loop portion is formed in the wire that is continuous with the ball portion, and that has a turned back portion more toward an interior of the semiconductor chip than the electrode pad, the wire is bonded to a connection terminal, and the semiconductor chip and the wire are sealed with the transparent resin; and when forming the loop portion in the wire the loop portion is formed so that predetermined clearances are provided between the loop portion and the ball portion, and between the loop portion and other portions of the wire.

According to the 8th aspect of the present invention, in the method for producing a semiconductor device according to the 7th aspect, it is preferred that: when the semiconductor chip and the wire are sealed with the transparent resin, they are sealed by potting.

According to the 9th aspect of the present invention, in the method for producing a semiconductor device according to the 7th or the 8th aspect, it is preferred that no filler made from silica is included in the transparent resin.

Advantageous Effect of Invention

According to this invention the loop portion is formed in the wire and has the turned back portion on the side opposite to the connection terminal, with predetermined clearances being provided both between the loop portion and the portion where the wire is bonded to the electrode pad, and between the loop portion and other portions of the wire. Due to this, it is possible to absorb thermal stresses by deformation of the loop portion of the wire, and thereby it is possible to lower the profile of the semiconductor device that is sealed with the transparent resin, and moreover it is possible to prevent breakage of the wire.

DESCRIPTION OF EMBODIMENTS

Overall Structure of a Semiconductor Device 100

Figure 1:
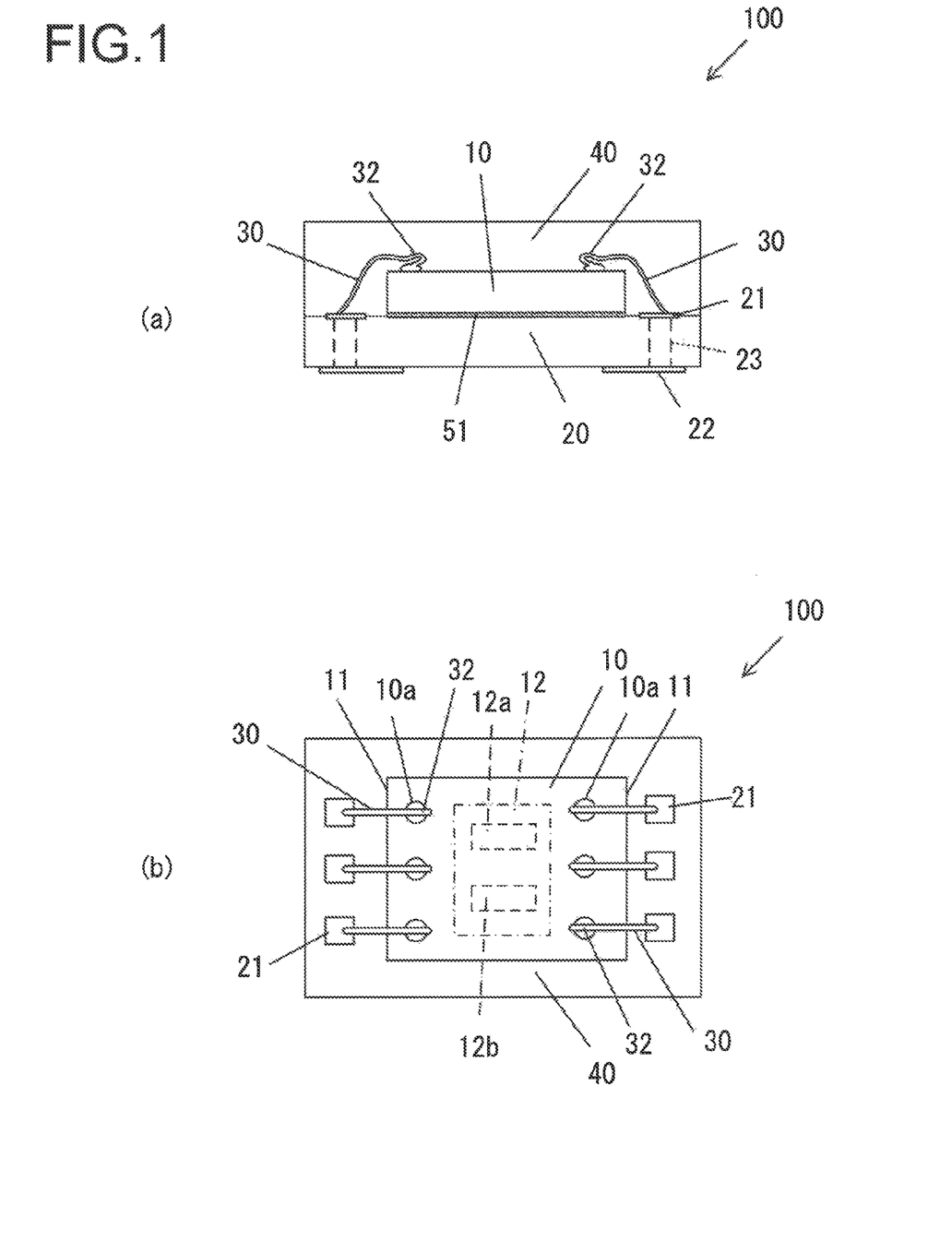
FIG. 1 A semiconductor device according to an embodiment of the present invention is shown, wherein (a) is a sectional view of this semiconductor device, while (b) is a plan view of the semiconductor device as seen from above.

In the following, embodiments of the semiconductor device according to the present invention and of a method for producing it will be explained with reference to the drawings. FIG. 1 shows an embodiment of a semiconductor device 100 according to the present invention, with FIG. 1(a) being a sectional view of this semiconductor device 100, and FIG. 1(b) being a plan view of the semiconductor device 100 as seen from above. The shown semiconductor device 100 according to this embodiment comprises a semiconductor chip 10, a circuit board (substrate) 20, wires 30, and transparent resin 40.

The semiconductor chip 10 has a rectangular shape in plan view, and includes a light reception section 12 at the center of its main surface (i.e. its upper surface) comprising a plurality of light reception elements (photodetectors) 12a, 12b. Next to the light reception section 12, a plurality of electrode pads 10a are arranged along each of a pair of side edges 11.

A wiring pattern (not shown in the drawings) is formed upon one surface (the upper surface) of the circuit board 20, and incorporates connection terminals 21 corresponding to the electrode pads 10a of the semiconductor chip 10, arranged along a pair of side edges 11 of the semiconductor chip. In FIG. 1(b), the pairs of connection terminals 21 that are arranged in two left and right columns are disposed along the side edges 11 of the semiconductor chip 10. The semiconductor chip 10 is die bonded with die bonding material 51 almost in the center between the pairs of connection terminals 21 that are thus arranged in two left and right columns. External terminals 22 are formed on the other surface of the circuit board 20 at positions that oppose these connection terminals 21, and each of the connection terminals 21 is connected to a corresponding one of these external terminals 22 via a through hole 23.

Wires 30 are made from a metallic material such as, for example, gold wire, copper, or a copper alloy. One end portion of each of the plurality of wires 30 is bonded to one of the electrode pads 10a of the chip 10, while its other end portion is bonded to a corresponding one of the connection terminals 21 of the circuit board 20. It is desirable for the connection portions between the wires 30 and the connection terminals 21 of the circuit board 20 to be separated from the regions of the through holes 23. However, if the construction is such that an electrically conductive material is charged into the through holes 23, then it will be no problem even if those connection portions are above the through holes 23. Loop portions 32 are formed in the wires 30 in the neighborhoods of bonded portions 31 (see FIG. 2) where the wires 30 are joined to the electrode pads 10a of the semiconductor chip 10. These wires 30 will be described hereinafter in detail.

The transparent resin 40 covers over the main surface of the semiconductor chip 10, over the entire wires 30 including the bonded portions 31 (refer to FIG. 2) where they are bonded to the electrode pads 10a of the semiconductor chip 10 and bonded portions 33 (refer to FIG. 2) where they are bonded to the connection terminals 21, and over the part of the surface of the circuit board 20 that is left exposed by the semiconductor chip 10. In other words, the transparent resin 40 serves as a sealing material that seals the semiconductor chip 10. The transparent resin 40, for example, may consist of epoxy resin or silicon resin, and may be formed by a molding method, potting or the like. For sealing by polling, it is not necessary to prepare any die, and this method is cheap and can be performed with good efficiency, but there is the problematical aspect that, with this semiconductor chip 10 upon which the wires 30 are provided, roughnesses (pits and bumps) may appear upon the surface of the resin. However, with this construction in which the loop portions 32 that are almost or substantially parallel to the main surface of the semiconductor chip 10 are formed in the wires 30, even if the transparent resin 40 is formed by potting, its front surface comes out as being almost flat. Due to this, in the shown semiconductor device 100 of the embodiment described above, it is desirable for the transparent resin 40 to be formed by polling. Moreover, in order to ensure the translucency of the transparent resin 40, it is desirable for no filler that reduces the coefficient of linear expansion of the resin 40 such as silica or the like to be mixed in with the transparent resin 40. However, it will be acceptable to mix in a minute amount of such a filler, up to a level at which a predetermined transparency for the transparent resin 40 is assured.

The Bonding Structures for the Wires 30

Figure 2:
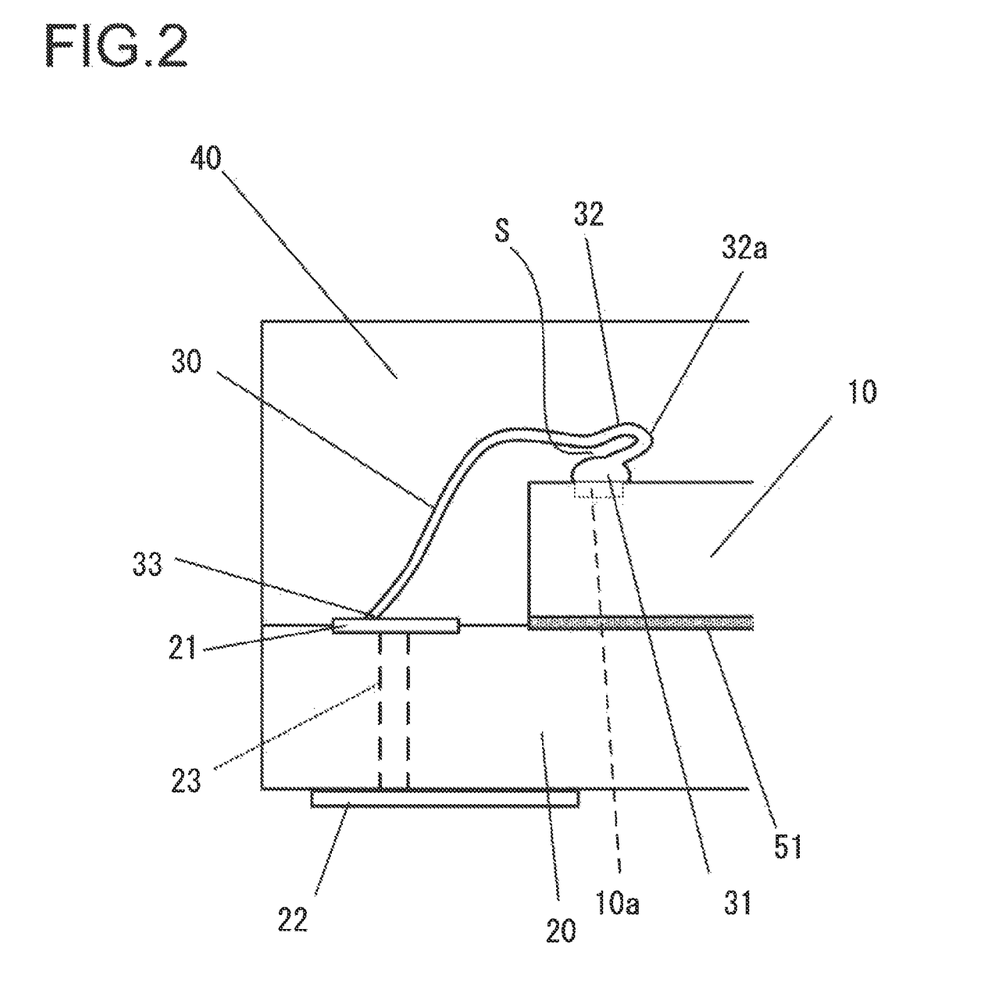
FIG. 2 An enlarged view of principal portions of the semiconductor device shown in FIG. 1 is shown.

FIG. 2 is an enlarged view of principal portions of the semiconductor device 100 shown in FIG. 1. One end portion of one of the wires 30 has a first bonded portion 31 that is bonded to one of the electrode pads 10a of the semiconductor chip 10. This first bonded portion 31 is a ball bonding portion formed by that one end portion of the wire 30 is melted so as to form a ball, and this ball is joined to the electrode pad, by a capillary 71 (refer to FIG. 4). The other end portion of the wire 30 has a second bonded portion 33 that is bonded to one of the connection terminals 21 of the circuit board 20. Furthermore, the wire 30 has a loop portion 32 that is formed to continue on from the first bonded portion 31.

The loop portion 32 has a shape that the wire is pulled out from the first bonded portion 31 in the direction away from the second bonded portion 33, then the wire is brought round and back at a turned back portion 32a, and then the wire extends toward the bonded portion 33. Along with the loop portion 32 being formed so as to be separated from the first bonded portion 31 by a clearance S, it also is formed so as to be separated from other portions of the wire 30 by a clearance S as well. In other words, a predetermined clearance S is provided both between the loop portion 32 and the first bonded portion 31, and also between the loop portion 32 and other portions of the wire 30. It is desirable for this clearance S to be around 0.3 to 1.5 times the diameter of the wire 30. The profile of the semiconductor device 100 becomes proportionately higher as the clearance S becomes greater. However, if the clearance S is not greater than 0.3 times the diameter of the wire 30, then the problem may arise of the loop portion 32 coming into contact with the first bonded portion 31 or with some other portion of the wire 30, thus constituting an obstacle to deformation of the wire 30.

Since the coefficients of linear expansion of the transparent resin 40, the semiconductor chip 10 made from silicon or the like, and the circuit board 20 are different, accordingly, as the temperature rises or falls, the upper portion of the semiconductor device 100 will deform to assume a convex shape or a concave shape. Thermal stress is applied to the wire 30 due to this deformation of the semiconductor device 100. But this thermal stress can be alleviated by deformation of this loop portion 32, since the loop portion 32 is formed in the wire 30. However, if the loop portion 32 were to contact the first bonded portion 31 or some other portion of the wire 30, then an obstacle would arise to deformation of the loop portion 32, and the possibility of breakage of the wire would become high. However, in the embodiment described above, the slight clearance S of, for example, around 0.3 to 1.5 times the diameter of the wire 30 is provided between the loop portion 32 and the first bonded portion 31. Accordingly it is possible to obtain the beneficial effect of prevention of breakage of the wire 30 originating in thermal stress, even with this construction in which the profile of the semiconductor device 100 is kept low.

Method for Producing the Semiconductor Device 100

A method for producing this semiconductor device 100 will now be explained. As shown in (a) and (b) of FIG. 1, the circuit board 20 is prepared with the connection terminals 21, the through holes 23, and the external terminals 22 arranged thereupon in two rows. The semiconductor chip 10, where the light reception section 12 is formed upon the main surface and the electrode pads are provided between the boundary of the light reception section 12 and a pair of mutually opposite side edges 11, is arranged between two columns of the connection terminals 21 which are arranged in the two columns on the circuit board 20 and is die bonded in that position. Due to this, the bottom surface of the semiconductor chip 10 is fixed upon the upper surface of the circuit board 20 by the die bonding material 51. Next, each of the electrode pads 10a of the semiconductor chip 10 is connected to a corresponding one of the connection terminals 21 of the circuit board 20 by wire bonding, using the wires 30. The details of the method employed for this wire bonding will be described hereinafter. And, using a molding method or a potting method or the like, the semiconductor chip 10 is sealed with transparent resin 40. This sealing with the transparent resin 40 is performed with the transparent resin 40 covering the main surface of the semiconductor chip 10, the entire wires 30 including their first bonded portions 31 that are joined to the electrode pads of the semiconductor chip 10 and also their second bonded portions 33 that are joined to the connection terminals 21, and the portion of the surface of the circuit board 20 that is left exposed, away from the semiconductor chip 10. The semiconductor device 100 shown in (a) and (B)) of FIG. 1 is manufactured in this manner. Next, the details of the wire bonding method will be explained.

The Wire Bonding Method

Figure 3:
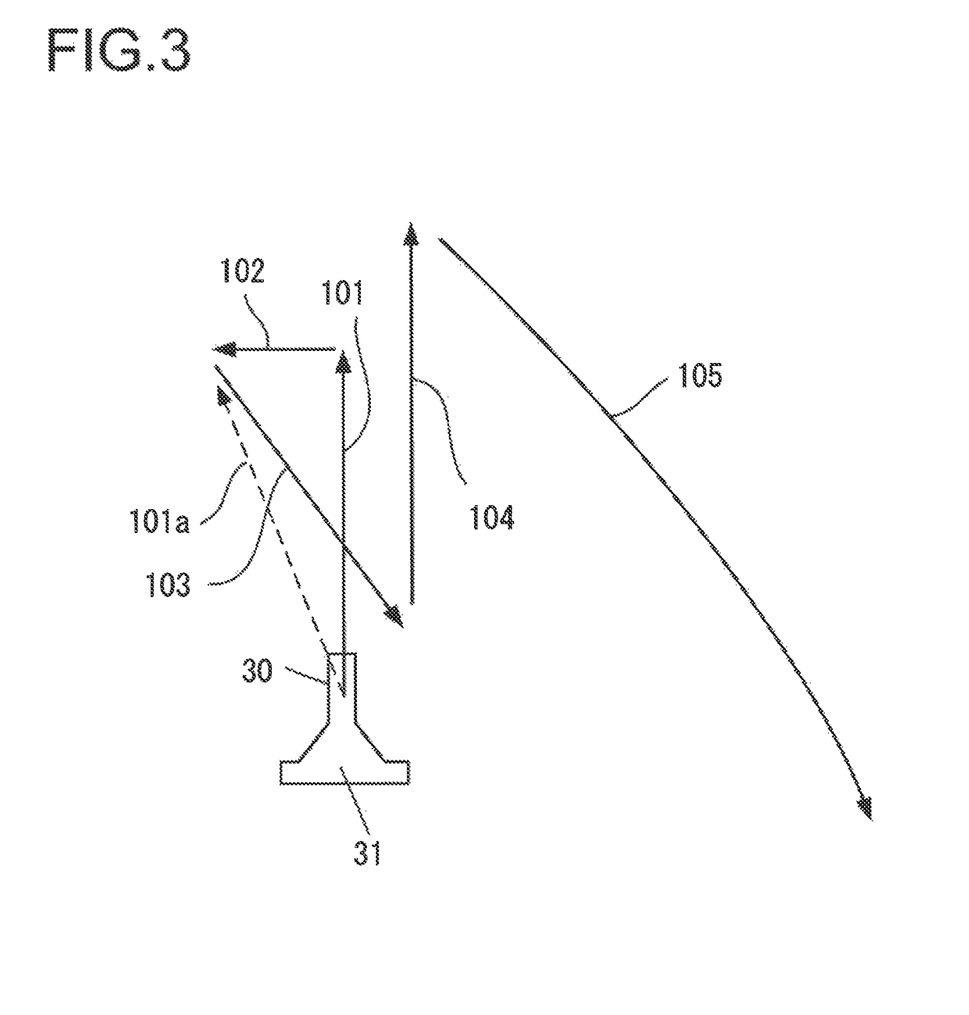
FIG. 3 A figure for explanation of the direction of shifting of a capillary while forming a wire having a loop portion shown in FIG. 2 is shown.
Figure 4:
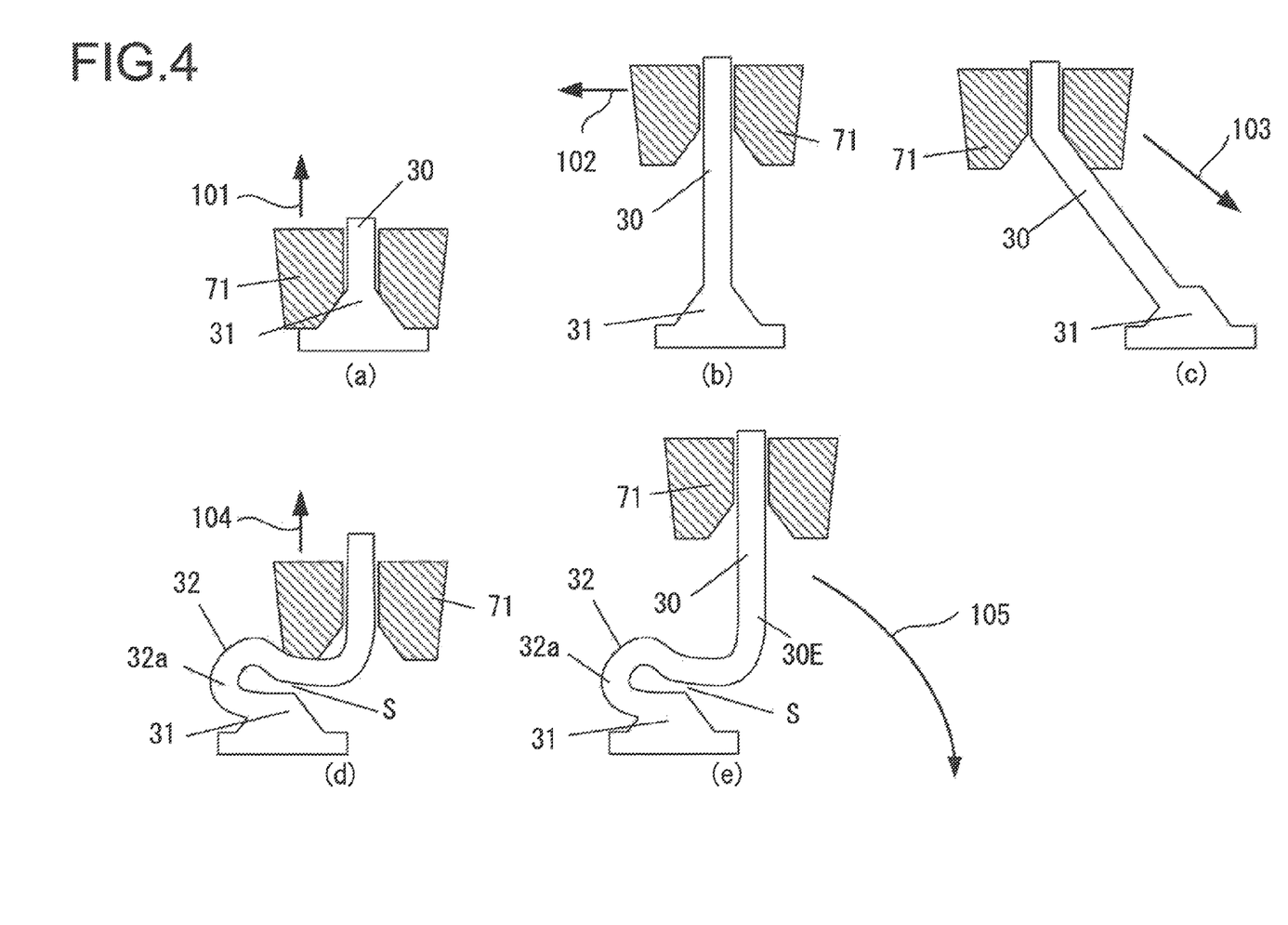
FIG. 4(a) through (e) show figures for explanation of the shape of the wire that is formed corresponding to the shifting of the capillary shown in FIG. 3.

FIG. 3 is a figure for explanation of the direction of shifting of the capillary during formation of the wire having the loop portion shown in FIG. 2, and (a) through (e) of FIG. 4 are figures for explanation of the shape of the wire that is formed corresponding to the shifting of the capillary shown in FIG. 3. In the following, this wire bonding method will be explained with reference to FIG. 3 and (a) through (e) of FIG. 4. One end of the wire 30 is formed into the shape of a ball due to application of heat by the capillary 71, and is ball bonded to one of the electrode pads 10a of the semiconductor chip 10. Thereby the first bonded portion 31 of the wire 30 is formed upon the electrode pad 10a of the semiconductor chip 10 (refer to FIG. 4(a)).

Then holding of the wire 30 by a wire clamper not shown in the figures is released, and the capillary 71 is shifted in an almost vertical direction as shown by the arrow sign 101, so that the end portion of the wire 30 is extended almost vertically from the first bonded portion 31 (refer to FIG. 4(b)).

Then, as shown by the arrow sign 102, the capillary 71 is shifted in the horizontal direction away from the connection terminal 21 to which bonding is to be performed. Thereby, the one end portion of the wire 30 is tilted from the first bonded portion 31 in the direction away from the connection terminal 21 to which bonding is to be performed (refer to FIG. 4(c)). It should be understood that, while it is desirable for this direction away from the connection terminal 21 to be a direction that is almost 180° away from the connection terminal 21, this should not be considered as being limitative of the present invention; it will be sufficient if this direction is a direction toward the interior of the semiconductor chip 10. Moreover, as the method of shifting the capillary 71 in the two directions shown by the arrow sign 101 and the arrow sign 102, it would also be acceptable to arrange to employ a method of shifting the capillary 71 diagonally upward, as shown by the arrow sign 101a in FIG. 3.

Then, as shown by the arrow sign 103, the capillary 17 is shifted diagonally downward toward the connection terminal 21 to which bonding is to be performed. Due to this the loop portion 32 is formed continuously with the first bonded portion 31 by being turned back at the turned back portion 32a (refer to FIG. 4(d)). This loop portion 32 is formed so that it does not contact either the first bonded portion 31 or any other portion of the wire 30, in other words so that a clearance S is present between it and the first bonded portion 31. While, as described above, it is desirable for this clearance S to be of the order of 0.3 to 1.5 times the diameter of the wire 30, this should not be considered as being limitative of the present invention. Moreover, as seen from the first bonded portion 31, the turned back portion 32a is formed so as to be positioned on the opposite side from the connection terminal 21 to which bonding is to be performed. By contrast, with a construction in which the turned back portion 32a of the loop portion 32 is positioned on the vertical from the first bonded portion 31 or on the same side as the connection terminal 21 to which bonding is to be performed, the profile of the wire 30, or to put it in another manner, the profile of the semiconductor device 100, will become higher.

In the formation of the loop portion 32 in the wire 30, it is necessary to shift the capillary 71 so that the loop portion 32 is turned back with respect to the extended portion of the wire 30. Accordingly, as shown in FIG. 4(c), it is desirable to shift the capillary 71 diagonally downward in the state in which the wire 30 is extended diagonally upward.

As shown by the arrow sign 104, the capillary 71 is then shifted in an almost vertical direction, so that an extended portion is formed in the wire 30 that is continuous with the loop portion 32 (refer to FIG. 4(e)).

Then, as shown by the arrow sign 105, the capillary 71 is shifted toward the connection terminal 21 to which bonding is to be performed. The capillary 71 could be shifted diagonally downward, or it could be shifted in two stages, first in the horizontal direction and then downward.

Heat is then applied to the wire 30 by the capillary 71 so that a portion of the wire 30 is melted and is bonded to the connection terminal 21, and then the wire 30 is cut. The second bonded portion 33 that connects to the connection terminal 21 is constituted by this other end portion of the wire 30. It would also be acceptable to arrange to form this second bonded portion 33 as a ball bonding portion.

As has been explained above, in the embodiment described above, the loop portion 32 having the turned back portion 32a on the opposite side to the connection terminal 21 is formed in the wire 30 at the first bonded portion 31 that is bonded to the electrode pad 10a while being kept separated both from that first bonded portion 31 and from other portions of the wire 30. Due to this, it is possible to absorb thermal stresses by deformation of the loop portion 32 of the wire 30, it is possible to lower the profile of the semiconductor device 100 that is sealed by the transparent resin 40, and moreover it is possible to prevent breakage of the wire 30.

It should be understood that, in the embodiment described above, an example was shown of a construction in which a semiconductor chip 10 was mounted upon a circuit board 20. However, it would also be acceptable to arrange to employ a lead frame, instead of the circuit board 20. In other words, it would be possible to adopt a construction in which the semiconductor chip 10 is die bonded to a lead frame main body, and each of the electrode pads of the semiconductor chip 10 is connected by a wire 30 to a corresponding connection terminal that is separate from the lead frame main body.

In the embodiment described above, an example was shown of a construction in which loop portions 32 were formed in all of the wires 30 that connected the electrode pads 10a of the semiconductor chip 10 and the connection terminals 21 of the circuit board 20. However, with a semiconductor device 100 that is rectangular in shape, the greatest thermal stresses act upon the corner portions. Because of this, it would also be acceptable to arrange to form the loop portions 32 only in those wires 30 that are provided in positions closest to the corners of the chip.

In the embodiment described above, an example was shown of a construction in which the circuit board 20 and the mass of transparent resin 40 had the same external shape and size. However, it is also possible to apply the present invention when the circuit board is large in shape and includes electronic components other than the semiconductor chip 10. In the case of a large circuit board, provided that the transparent resin 40 is of adequate shape and size to seal the semiconductor chip 10 and the wires 30, it will be acceptable to leave other regions of the circuit board exposed, and not to cover them with the transparent resin 40.

While, in the embodiment described above, a semiconductor device 100 of the dual flat type was described as an example, it would also be possible to apply the present invention to a quad flat type semiconductor device. Moreover, the present invention could also be applied to a single line type semiconductor device, or to a solid type semiconductor device such as an LED or an organic EL or the like.

Apart from the above, the invention can be applied in many varied manners within the range of the gist of the present invention; the point is that it is sufficient, in a semiconductor device in which an electrode pad of a semiconductor chip and a connection terminal are connected together by a wire, and the semiconductor device is sealed with transparent resin: to form a turned back portion on the wire on the side opposite to the connection terminal, and moreover to form a loop portion that is spaced apart, both from the portion that is bonded to the electrode pad, and also from other portions of the wire.

The content of the disclosure of the following application, upon which priority is claimed, is hereby incorporated herein by reference:

Japanese patent application 2013-247099 (filed on 29 Nov. 2013).

REFERENCE SIGNS LIST

10: semiconductor chip
20: circuit board (substrate)
21: connection terminal
30: wire
31: first bonded portion
32: loop portion
32a: turned back portion
33: second bonded portion
40: transparent resin
100: semiconductor device

The invention claimed is:

1. A semiconductor device, comprising:
a connection terminal;
a semiconductor chip having an electrode pad on one surface;
a wire that connects the connection terminal and the electrode pad of the semiconductor chip; and
transparent resin that covers the one surface of the semiconductor chip, and that seals the connection terminal and the wire, wherein:
the wire includes a first bonded portion that is joined to the electrode pad, a second bonded portion that is joined to the connection terminal, and a loop portion that is formed so as to be continuous with the first bonded portion and has a turned back portion on a side opposite to the second bonded portion with reference to the first bonded portion, wherein the turned back portion projects from the first bonded portion in a direction opposite from a location of the second bonded portion; and predetermined clearances are provided between the loop portion and the first bonded portion, and between the loop portion and other portions of the wire in order that the loop portion does not contact with the first bonded portion and the other portions of the wire; and the loop portion is formed so as to be substantially parallel to a main surface of the semiconductor chip on which the electrode pad is provided where the loop portion extends toward the second bonded portion from the turned back portion.

2. A semiconductor device, comprising:
a connection terminal;
a semiconductor chip having an electrode pad on one surface;
a wire that connects the connection terminal and the electrode pad of the semiconductor chip; and
transparent resin that covers the one surface of the semiconductor chip, and that seals the connection terminal and the wire, wherein:
the wire includes a first bonded portion that is joined to the electrode pad, a second bonded portion that is joined to the connection terminal, and a loop portion that is formed so as to be continuous with the first bonded portion and has a turned back portion on a side opposite to the second bonded portion with reference to the first bonded portion, wherein the turned back portion projects from the first bonded portion in a direction opposite from a location of the second bonded portion;
predetermined clearances are provided between the loop portion and the first bonded portion, and between the loop portion and other portions of the wire in order that the loop portion does not contact with the first bonded portion and the other portions of the wire; and
a clearance that separates the loop portion and the first bonded portion is around 0.3 to 1.5 times a diameter of the wire.

3. The semiconductor device according to claim 1, further comprising:
a board, wherein:
the connection terminal is provided upon the board; and
the semiconductor chip is die bonded upon the board.

4. The semiconductor device according to claim 1, wherein:
no filler made from silica is included in the transparent resin.

5. The semiconductor device according to claim 1, wherein:
the one surface of the semiconductor chip is shaped as rectangular;
the semiconductor chip has a plurality of electrode pads arranged along each of at least a pair of mutually opposing side edges of the one surface;
connection terminals are arranged to correspond to the electrode pads;
each of the connection terminals and each of the electrode pads are connected together by one of the wire; and
the loop portion is formed upon at least the wire that is provided in a position closest to a corner portion of the semiconductor chip.

6. The semiconductor device according to claim 5, wherein
the loop portion is formed in all wires.

7. A method for producing a semiconductor device, comprising:

providing a board upon which connection terminals are formed;
mounting upon the board a semiconductor chip upon which electrode pads are formed, and bonding each of the connection terminals and each of the electrode pads by a wire; and
sealing a main surface of the semiconductor chip, the wire, and a portion of the board that is not covered by the semiconductor chip, with transparent resin, wherein:
when wire bonding each of the connection terminals and each of the electrode pads
one end of the wire is ball bonded upon an electrode pad, and a ball portion is formed upon the electrode pad,
a loop portion is formed in the wire that is continuous with the ball portion, and that has a turned back portion more toward an interior of the semiconductor chip than the electrode pad,
the wire is bonded to a connection terminal, and
the semiconductor chip and the wire are sealed with the transparent resin; and
when forming the loop portion in the wire
the loop portion is formed so that predetermined clearances are provided between the loop portion and the ball portion, and between the loop portion and other portions of the wire in order that the loop portion does not contact with the ball portion and the other portions of the wire,
the loop portion is formed so as to be substantially parallel to the main surface of the semiconductor chip on which the electrode pads are provided where the loop portion extends toward a connection terminal bonded portion, which is joined to the connection terminal, from the turned back portion, wherein the turned back portion projects from the ball portion in a direction opposite from a location of the connection terminal bonded portion.

8. The method for producing a semiconductor device according to claim 7, wherein:
when the semiconductor chip and the wire are sealed with the transparent resin, they are sealed by potting.

9. The method for producing a semiconductor device according to claim 7, wherein:
no filler made from silica is included in the transparent resin.

10. The semiconductor device according to claim 2, further comprising:
a board, wherein:
the connection terminal is provided upon the board; and
the semiconductor chip is die bonded upon the board.

11. The semiconductor device according to claim 2, wherein:
no filler made from silica is included in the transparent resin.

12. The semiconductor device according to claim 2, wherein:
the one surface of the semiconductor chip is shaped as rectangular;
the semiconductor chip has a plurality of electrode pads arranged along each of at least a pair of mutually opposing side edges of the one surface;
connection terminals are arranged to correspond to the electrode pads;
each of the connection terminals and each of the electrode pads are connected together by one of the wire; and the loop portion is formed upon at least the wire that is provided in a position closest to a corner portion of the semiconductor chip.

13. The semiconductor device according to claim 12, wherein
the loop portion is formed in all wires.

* * * * *